United States Patent [19]

Petrow

[11] Patent Number: 4,806,895
[45] Date of Patent: Feb. 21, 1989

[54] TOROIDAL COIL MOUNT

[75] Inventor: William M. Petrow, Prospect Heights, Ill.

[73] Assignee: Zenith Electronics Corporation, Glenview, Ill.

[21] Appl. No.: 107,089

[22] Filed: Oct. 8, 1987

[51] Int. Cl.$^4$ .............................................. H01F 15/02
[52] U.S. Cl. ........................................ 336/65; 336/67; 336/229; 248/71; 248/500
[58] Field of Search ................... 336/65, 67, 92, 100, 336/218, 229; 174/164; 248/71, 73, 74.1, 500, 507, 508, 510; 24/16 PB, 17 B, 30.5 P; 411/913

[56] References Cited

U.S. PATENT DOCUMENTS

| | | | |
|---|---|---|---|
| 780,957 | 1/1905 | Palmer | 248/71 X |
| 2,918,240 | 12/1959 | Wiegand | 248/71 |
| 3,015,869 | 1/1962 | Rapata | 248/73 |
| 3,118,200 | 1/1964 | Bell | 24/16 PB |
| 3,154,281 | 10/1964 | Frank | 248/71 X |
| 3,325,135 | 6/1967 | Clarke | 248/508 X |
| 3,367,701 | 2/1968 | Wenk, Jr. | 24/16 PB |
| 3,518,727 | 7/1970 | Eberle et al. | 24/16 PB |
| 3,634,798 | 1/1972 | Astleford, Jr. et al. | 336/100 X |
| 3,683,303 | 8/1972 | Ayano et al. | 336/100 |
| 3,748,696 | 7/1973 | Martin | 24/16 PB |
| 3,905,570 | 9/1975 | Nieuwveld | 411/913 X |
| 4,010,503 | 3/1977 | Denton | 24/16 PB |

FOREIGN PATENT DOCUMENTS

| | | | |
|---|---|---|---|
| 2257605 | 5/1974 | Fed. Rep. of Germany | 336/65 |
| 2937030 | 4/1980 | Fed. Rep. of Germany | 248/71 |
| 2909436 | 9/1980 | Fed. Rep. of Germany | 248/71 |
| 144007 | 7/1886 | Japan | 336/218 |
| 1205876 | 9/1970 | United Kingdom | 248/71 |
| 1296677 | 11/1972 | United Kingdom | 248/73 |

Primary Examiner—Thomas J. Kozma

[57] ABSTRACT

A mounting device includes a clamp-like first end portion adapted to engage an upper portion of a ferrite core and toroidal winding combination and an elongated, linear second end portion. Disposed along the length of the second end portion of the mounting device in a spaced manner are a plurality of transverse, flexible fingers. The second end portion of the mounting device is adapted for insertion through an aperture in a printed wiring board (PWB), such that the flexible fingers are deflected upon insertion of the mounting device through the aperture and prevent the removal of the mounting device from the PWB. A double coated foam-type tape or an epoxy glue is disposed between the PWB and a lower portion of the coil/core combination as well as between the first upper end portion of the mounting device and an upper portion of the coil/core combination to protect the toroidal winding from unnecessary contact and possible damage and to maintain the mounted assembly under tension. The portion of the mounting device extending through and beyond the PWB is cut away prior to wave soldering of the ends, or leads, of the toroidal coil to circuitry on the PWB.

22 Claims, 3 Drawing Sheets

TOROIDAL COIL MOUNT

BACKGROUND OF THE INVENTION

This invention relates generally to the mounting of electronic components and is particularly directed to the mounting of a toroidal coil and ferrite core assembly on a printed wiring board (PWB).

In many electronic circuits, a conducting coil is wound around a doughnut-shaped core for providing the circuit with a desired inductance. The core possesses high magnetic permeability and is typically comprised of a ferrite or ceramic material. The ends of the coil are coupled such as by soldering to respective conductors on a PWB upon which the toroidal coil and core combination is mounted.

Because space is at a premium on the PWB, the toroidal coil/core combination is generally mounted in an upright position using any one of several well known mounting arrangements. For example, FIG. 1 illustrates the combination of a toroidal coil 10 and core 12 mounted to a PWB 14 by means of the combination of glue, or epoxy cement, and a curved mounting base 18. In mounting the toroidal coil and core combination on the PWB 14, a glue applicator 22 is used to apply various glue portions 20a, 20b and 20c to the PWB 14, the mounting base 18, and the toroidal coil/core combination. In this manner, the toroidal coil/core combination is affixed to an upper portion of the mounting base 18 which, in turn, is attached to one surface of the PWB 14. Each of the ends 16 of the toroidal coil 10 typically extend through respective apertures in the PWB 14 and are coupled such as by soldering to circuitry (not shown) on the PWB.

Another prior art approach, as shown in FIG. 2, makes use of one or more threaded mounting pins 38 inserted through an aperture in the PWB 33 for securely engaging a contoured mounting base 34 and maintaining it in position on the PWB. Glue or epoxy cement 36 is positioned on the upper, concave surface of the mounting base 34 for adhering to the combination of a toroidal coil 30 and core 32. Respective ends 30a, 30b of the toroidal coil extend through apertures in the PWB 33 upon which the toroidal coil and core combination are mounted. FIG. 3 illustrates another arrangement for mounting the combination of a toroidal coil 40 and core 42 to a PWB. In this approach, the toroidal coil/core combination is positioned in the upper, open portion of a potting tub 44. A potting compound (not shown) is deposited in the upper, open portion of the potting tub 44 for engaging the toroidal coil/core combination and maintaining it securely coupled to and positioned within the potting tub. The ends 40a, 40b of the toroidal coil 40 extend downward, beyond the potting tub 44 and are coupled to appropriate circuitry on the PWB upon which the potting tub is mounted.

Referring to FIG. 4, there is shown yet another arrangement for securely attaching a toroidal coil 48 and core 50 to a PWB, which is not shown in FIG. 4 for simplicity. In this approach, the toroidal coil/core combination is securely attached to a vertical support member 52 which, in turn, is mounted to a supporting PWB. The toroidal coil/core combination is typically attached to the vertical support member 52 by glue or a tie wrap or may be adapted for snap-in engagement with the vertical support member. Respective ends 48a, 48b of the toroidal coil 48 extend downward from the vertical support member 52 for coupling to circuitry on the PWB.

Another prior art approach is illustrated in FIG. 5 where a tie wrap 64 disposed about the circular periphery of the core 58 is securely attached at its respective ends to a PWB 60 by means of glue or epoxy cement 62. As shown in FIG. 5, the toroidal coil 56 is wound around the core 58 and outside of the tie wrap 64. FIG. 6 illustrates still another prior art approach for attaching a toroidal coil 66 and core 68 to a PWB 74. In the arrangement of FIG. 6, glue 72 is deposited on the PWB 74 and the toroidal winding/core combination is then placed in intimate contact with the glue. In the same manner as shown in the FIG. 5 embodiment, a tie wrap is then inserted through and around the toroidal coil/core combination and is inserted through a pair of apertures in the PWB 74 and is fastened thereto. The "nonbased" mounting approach of FIG. 6 does not include the previously discussed contoured mounting base or potting tub. However, this mounting approach is time consuming and requires access to both sides of the PWB during installation.

All of the aforementioned prior art mounting approaches suffer from one or more shortcomings. For example, the gluing of the toroidal coil directly to the PWB surface increases the risk of adhesive contaminating the solder joints at respective ends of the coil Positioning of the adhesive in direct contact with the toroidal coil also makes PWB repair and toroidal coil replacement more difficult. The use of potting tubs or contoured base mounts requires an additional component to be inserted on the PWB in a labor intensive procedure involving either the insertion of threaded screws or one or more deposits of glue or epoxy cement. The incorporation of a vertical support member also requires the installation of an additional component as well as the separate step of attaching the toroidal coil/core combination to the vertical support member. Finally, the use of tie wraps involves manual manipulation in a labor intensive operation and requires access to both sides of the PWB.

The present invention overcomes the aforementioned limitations of the prior art by providing for the secure attachment of a toroidal coil/core combination to a PWB using a single mounting device which is easily inserted through and attached to a PWB while simultaneously engaging the toroidal coil/core combination and maintaining it in intimate contact with and securely attached to the PWB.

OBJECTS OF THE INVENTION

Accordingly, it is an object of the present invention to provide improved mounting for a toroidal coil on a PWB.

Another object of the present invention is to facilitate and reduce the cost of mounting a toroidal coil on a PWB.

Still another object of the present invention is to more securely attach the combination of a toroidal coil and magnetic core to a PWB.

A further object of the present invention is to provide a more shock- and vibration-resistant mounting for a toroidal coil/core combination on a PWB.

BRIEF DESCRIPTION OF THE DRAWINGS

The appended claims set forth those novel features which characterize the invention. However, the invention itself, as well as further objects and advantages thereof, wil best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENTS

Figure 7:
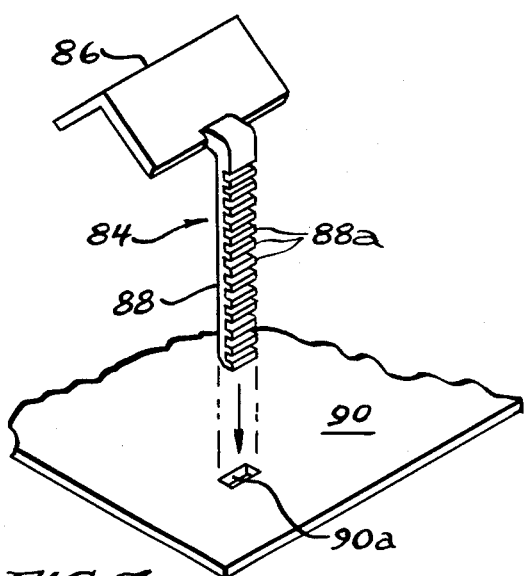
FIG. 7 is a perspective view of a toroid holder illustrating the manner in which the toroidal holder is attached to a PWB in accordance with the principles of the present invention.

Referring to FIG. 7, there is shown an upper perspective view of a toroid holder 84 in accordance with the present invention. The toroid holder 84 includes an upper portion 86 and a lower portion 88. The holder's upper portion 86 includes a recessed lower surface which is adapted to receive and engage an upper portion of a toroidal coil/core combination as described in detail below. The toroid holder's lower portion 88 is elongated and linear and includes a plurality of spaced teeth 88a along the length thereof. The toroid holder's upper and lower portions 86, 88 are formed of a unitary structure such as of molded plastic. The toroid holder's lower portion 88 is adapted for insertion through an aperture 90a in a PWB 90.

Figure 1:
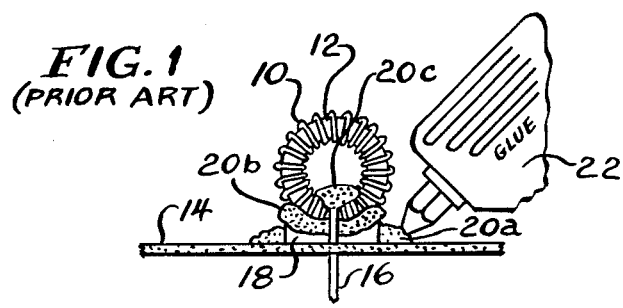
FIGS. 1-6 illustrate various prior art toroidal coil mounting arrangements.
Figure 2:
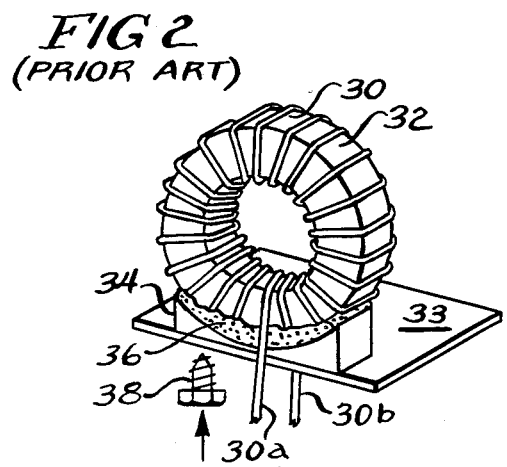
Figure 3:
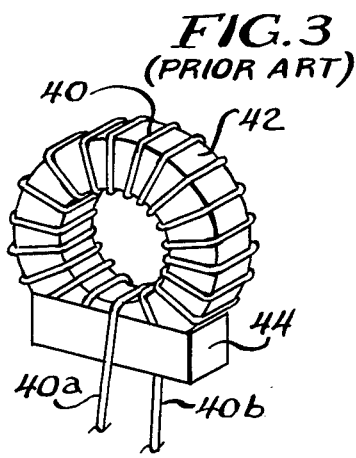
Figure 4:
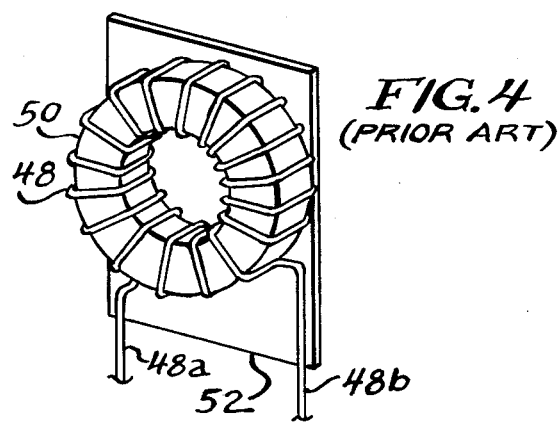
Figure 5:
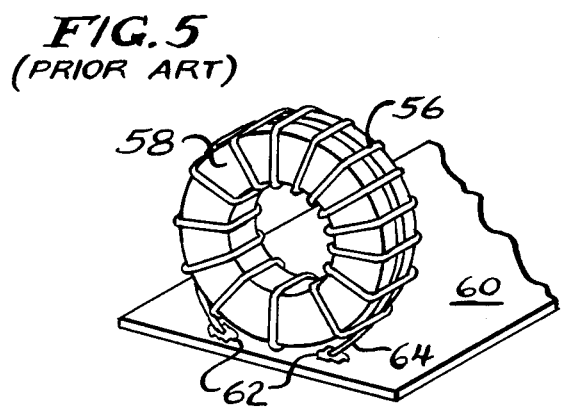
Figure 6:
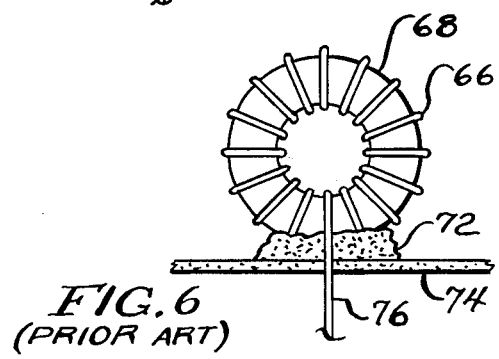
Figure 8:
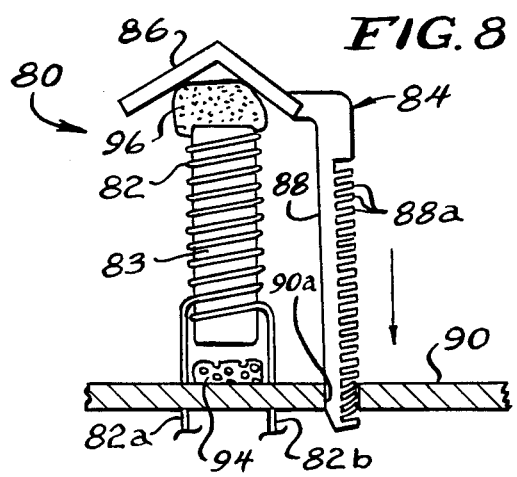
FIG. 8 shows the toroid holder being inserted through an aperture in the PWB.
Figure 9:
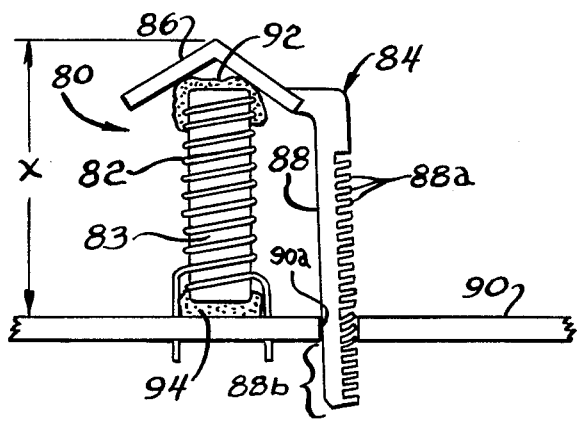
FIG. 9 illustrates the toroid holder fully inserted in a PWB and engaging a toroidal coil/core combination for securely maintaining the combination in position on the PWB.

Referring to FIGS. 8 and 9, there is shown the manner in which the toroid holder 84 of the present invention is attached to a PWB 90 and engages and maintains a toroidal coil 82 and core 83 securely in position on the PWB. In FIG. 8, the lower end of the lower portion 88 of the toroid holder 84 is shown being inserted in the PWB's aperture 90a. Disposed between a lower portion of the core 83 and PWB 90 is a compressible, double coated foam tape 94. Each of the ends 82a, 82b of the toroidal coil 82 are inserted through a respective aperture (not shown) in the PWB 90. Positioned on an upper portion of the toroidal coil/core combination is a hot melt or epoxy cement 96. As the toroid holder 84 is inserted in the PWB's aperture 90a and displaced downward in the direction of the arrow in FIG. 8, the toroid holder's upper portion 86 engages the epoxy cement 96 and forces the toroidal coil/core combination downward while compressing the epoxy cement and foam tape 94. With the toroid holder 84 fully inserted through the aperture 90a in the PWB 90 as shown in FIG. 9, a cut-off portion 88b of the toroid holder's lower portion 88 extends below the PWB. In this position, the toroid holder's upper portion 86 exerts a compressive force upon the toroidal coil/core combination securely maintaining it in position on the PWB 90. Once fully inserted through the PWB 90, the cut-off portion 88b of the toroid holder 84 is removed so as not to extend below the PWB. The height "X" which the toroid holder 84 extends above the PWB 90 is adjustable allowing the toroid holder to engage and securely maintain in position toroid coil/core combinations having a wide range of sizes.

Figure 8A:
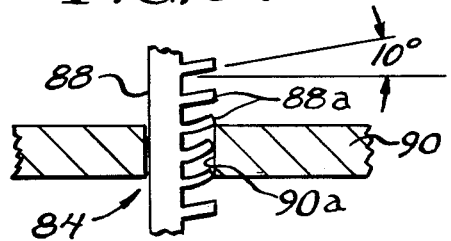
FIG. 8a illustrates the details of the engagement of the toroidal holder with the PWB.

Referring to FIG. 8a, there is shown the manner in which the toroid holder 84 engages the PWB 90. In a preferred embodiment, the toroid holder 84 is comprised of a unitary structure of semi-rigid, resilient material such as a hard plastic. As such, each of the teeth 88a on the toroid holder's lower portion 88 is flexible and is deflected as the toroid holder is inserted through the PWB's aperture 90a. In addition, each of the teeth 88 is oriented at an upward angle relative to the longitudinal axis of the toroid holder's lower portion 88. In a preferred embodiment, each of the teeth 88 forms an angle of approximately 10° with the plane extending through the toroid holder and oriented transverse to its lower portion 88. Thus, as the toroid holder's lower portion 88 is inserted through the PWB's aperture 90a, each of the teeth 88a is sequentially engaged by the PWB 90 and deflected upward as shown in FIG. 8a. When the toroid holder 84 is fully inserted in the PWB's aperture 90a in the full down position, one or more of the teeth 88a will be disposed within the PWB's aperture and will engage an immediately adjacent edge of the PWB so as to securely maintain the toroid holder in position therein. Engagement of the PWB 90 by one or more of the aforementioned teeth 88a and the manner in which the PWB maintains the aforementioned teeth in a crimped configuration prevents the toroidal holder 84 from being withdrawn from the PWB and maintains the toroidal coil/core combination securely in position on the PWB.

Figure 10:
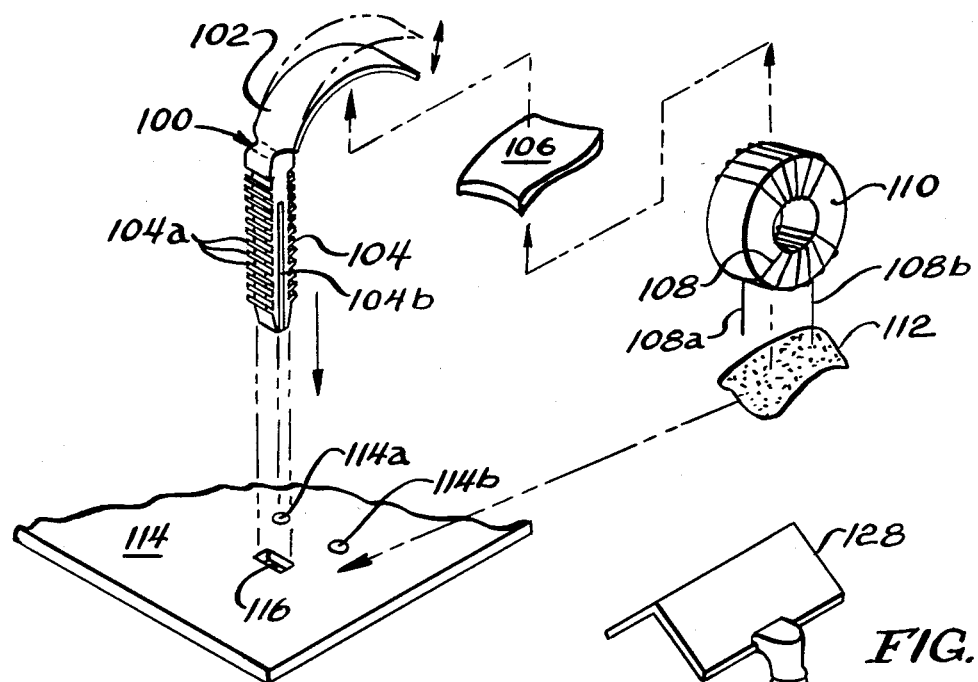
FIG. 10 is an exploded perspective view illustrating another embodiment of a toroid holder and the manner in which it engages and maintains a toroidal coil/core combination in position on a PWB in accordance with the present invention.
Figure 11:
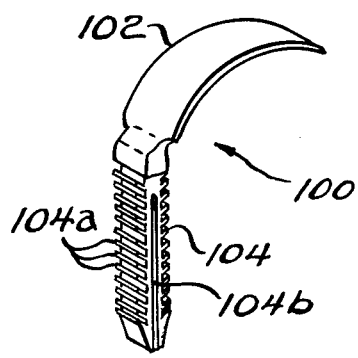
FIG. 11 is a perspective view of the toroid holder shown in FIG. 10.

Referring to FIG. 10, there is shown an exploded upper perspective view of another embodiment of a toroidal holder 100 in accordance with the present invention for maintaining a toroidal coil 108 and core 110 securely in position on a PWB 114. In the arrangement of FIG. 10, the toroid holder's upper portion 102 is curvilinear and is adapted to engage the upper portion of the toroidal coil/core combination in the plane of the core. Thus, rather than engaging the toroidal coil/core combination generally transverse to the plane of the core, the toroid holder 100 in FIG. 10 engages the toroidal coil/core combination within, or along, the plane of the core. the toroid holder's lower portion 104 includes a pair of facing, spaced sections separated by a slot 104b, see FIG. 11. Each of the facing sections of the toroid holder's lower portion 104 is provided with a plurality of spaced, parallel teeth 104a similar to previously described teeth 88a. The toroid holder's lower portion 104 is adapted for insertion through and positioning within an aperture 116 in a PWB 114. As described, the toroid holder 100 is preferably comprised of a flexible, semi-rigid, resilient material such that the slot 104b within its lower portion 104 permits each of the facing sections into flex toward one another to facilitate insertion of the toroid holder through the PWB's aperture 116. In addition, the resilient, semi-rigid structure of the toroid holder 100 permits the facing sections of the toroid holder's lower portion 104 to urge the teeth 104a in secure engagement with facing edges of the PWB 114 defining the aperture 116 therein. In this manner, the toroid holder 100 as well as the toroidal coil/core combination are securely maintained in position on the PWB 114. Foam tape 106 is positioned between the toroid holder's upper portion 102 and the toroidal coil/core combination. Similarly, foam tape 112 is positioned between a lower portion of the toroidal coil/core combination and the PWB 114. The compressibility of the foam tape portions 106, 112 permits the toroidal coil/core combination to be securely maintained in position on the PWB 114 in a compressed manner. The two foam tape portions also prevent the toroidal coil 108 from contacting either the toroid holder 100 or the PWB 114 and being damaged thereby. A pair of spaced apertures 114a, 114b in the PWB 114 are adapted to receive respective ends 108a and 108b of the toroidal coil 108 permitting the toroidal coil to be electrically coupled to conductors (not shown) on the lower surface of the PWB 114.

Figure 12:
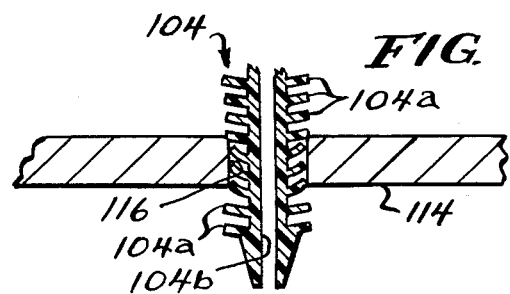
FIG. 12 is a sectional view illustrating the manner in which the toroid holder illustrated in FIG. 10 engages and is maintained in position in a PWB.

Referring to FIG. 12, there is shown in detail the manner in which the toroid holder 100 engages and is securely maintained in position in the PWB 114. As previously described, the toroid holder's lower portion 104 is inserted through the PWB's aperture 116. A slot 104b extending substantially the entire length of the toroid holder's lower portion 104 allows the facing lower portion sections to flex, or be displaced, toward and away from one another. On the outer surface of each of the lower portion sections are a plurality of spaced teeth 104a extending outward from the lower portion 104. Each of the teeth 104a is angled upward, or toward the toroid holder's upper portion, see FIG. 12. The angled orientation of each of the teeth 104a and the manner in which each tooth is engaged by the facing edges of PWB 114 that define aperture 116 is distinctly shown in FIG. 12. Thus, as the toroid holder is inserted through aperture 116, the PWB edges defining aperture 116 prevent the toroid holder from being pulled out or removed from the PWB and securely maintain the toroid coil/core combination in position on the PWB. It should be noted that the end of the PWB's lower portion 104 is tapered to facilitate its insertion in an aperture in a PWB.

Figure 13:
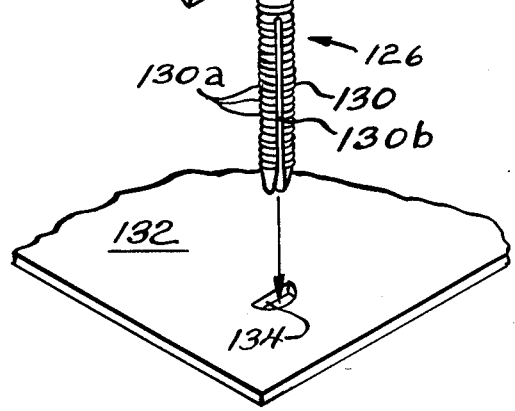
FIG. 13 is a perspective view of another embodiment of the invention.

Referring to FIG. 13, there is shown yet another arrangement of a toroid holder 126 in accordance with the present invention. The toroid holder 126 includes an upper portion 128 and a lower portion 130 having a slot 130b extending substantially the length thereof. The slot 130b in the toroid holder's lower portion 130 divides the lower portion into a pair of spaced, elongated, linear sections each of which is provided on an outer portion thereof with a plurality of teeth 130a. Each of the lower portion sections is adapted for insertion in and through an aperture 134 in a PWB 132. The toroid holder's lower portion 130 is provided with a semi-circular cross section which is matched to the shape of the PWB's aperture 134. The distal end of the toroid holder's lower portion 104 is tapered to facilitate its insertion in the PWB's aperture 134. The semi-circular cross sectional shape of the toroidal holder's lower portion 130 provides a keying function to ensure that the toroid holder as well as the toroid coil/core combination are properly positioned upon the PWB 132.

There has thus been shown an arrangement for facilitating the mounting of a toroidal coil/core combination on a PWB and maintaining the combination securely in position thereon. The toroidal coil mounting arrangement of the present invention includes a single component adapted for insertion through and positioning in an aperture in the PWB and engaging and urging the toroidal coil/core combination toward the PWB in maintaining the combination in secure position thereon.

While particular embodiments of the present invention have been shown and described, it will be obvious to those skilled in the art that changes and modifications may be made without departing from the invention in its broader aspects. For example, while the present invention has been described in terms of mounting of a toroidal coil/core combination on a PWB, it is not limited to this environment but could be used to mount such a combination on virtually any support structure. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. An apparatus mounting a toroidal coil/core combination to a support structure having an aperture therein comprising:
   first engaging means adapted for insertion in the support structure's aperture securely engaging the support structure, wherein said first engaging means includes keying means for permitting said apparatus to be attached to said support structure only in a given, predetermined orientation; and
   second engaging means coupled to said first engaging means engaging and urging the toroidal coil/core combination in intimate contact with the support structure when said first engaging means is inserted in the support structure's aperture.

2. The apparatus support structure and coil/core combination of claim 1 wherein said first and second engaging means are comprised, in combination, of a unitary structure.

3. The apparatus support structure and coil/core combination of claim 2 wherein said unitary structure is comprised of a semi-rigid, resilient material.

4. The apparatus support structure and coil/core combination of claim 3 wherein said semi-rigid, resilient material is comprised of plastic.

5. The apparatus support structure and coil/core combination of claim 1 wherein said first engaging means comprises an elongated, linear member having a plurality of spaced teeth along at least a portion of the length thereof.

6. The apparatus support structure and coil/core combination of claim 5 wherein said elongated, linear member has a tapered distal end.

7. The apparatus support structure and coil/core combination of claim 6 wherein said teeth are angled generally away from the tapered distal end of said elongated, linear member.

8. The apparatus support structure and coil/core combination of claim 1 wherein said first engaging means includes a pair of spaced, elongated, linear, parallel members separated by a slot.

9. The apparatus support structure and coil/core combination of claim 8 wherein each of said spaced members includes a respective plurality of teeth along the length thereof.

10. The apparatus support structure and coil/core combination of claim 9 wherein each of said teeth is angled generally away from a respective distal end of each of said spaced members.

11. The apparatus support structure and coil/core combination of claim 9 wherein said apparatus is comprised of a resilient, semi-rigid material.

12. The apparatus support structure and coil/core combination of claim 11 wherein the distal end of each of said spaced members is tapered.

13. The apparatus support structure and coil/core combination of claim 1 wherein said keying means comprises a cross section of said first engaging means which is complementary to the aperture in the support structure.

14. The apparatus support structure and coil/core combination of claim 13 wherein the cross section of said first engaging means and the aperture in the support structure are semi-circular.

15. The apparatus support structure and coil/core combination of claim 1 wherein said second engaging means includes a recessed lower portion engaging an upper portion of the toroidal coil/core combination.

16. The apparatus support structure and coil/core combination of claim 15 wherein the recessed lower portion of said second engaging means is concave.

17. The apparatus support structure and coil/core combination of claim 15 wherein the recessed lower portion of said second engaging means includes a pair of coupled, angled, flat members.

18. The apparatus support structure and coil/core combination of claim 15 wherein the recessed lower portion of said second engaging member engages the toroidal core/coil combination generally transverse to the plane of said combination.

19. The apparatus support structure and coil/core combination of claim 15 wherein the recessed lower portion of said second engaging member engages the toroidal core/coil combination generally in the plane of said combination.

20. The apparatus support structure and coil/core combination of claim 1 further comprising resilient spacer means disposed between said second engaging means and the toroidal coil/core combination and between the support structure and the toroidal coil/core combination.

21. The apparatus support structure and coil/core combination of claim 20 wherein said resilient spacer means is comprised of foam type.

22. The apparatus support structure and coil/core combination of claim 1 wherein the support structure is a printed wiring board.

* * * * *